(12) United States Patent
Martin et al.

(10) Patent No.: US 12,438,097 B2
(45) Date of Patent: *Oct. 7, 2025

(54) INTEGRATED POWER MODULE

(71) Applicant: WOLFSPEED, INC., Durham, NC (US)

(72) Inventors: Daniel John Martin, Fayetteville, AR (US); Brett Edward Sparkman, Springdale, AR (US); Ty McNutt, Farmington, AR (US); Paul Wheeler, Allen, TX (US)

(73) Assignee: Wolfspeed, Inc., Durham, NC (US)

( * ) Notice: Subject to any disclaimer, the term of this patent is extended or adjusted under 35 U.S.C. 154(b) by 251 days.

This patent is subject to a terminal disclaimer.

(21) Appl. No.: 18/161,983

(22) Filed: Jan. 31, 2023

(65) Prior Publication Data

US 2023/0170306 A1    Jun. 1, 2023

Related U.S. Application Data

(63) Continuation of application No. 17/178,435, filed on Feb. 18, 2021, now Pat. No. 11,569,174.

(51) Int. Cl.
*H01L 23/538* (2006.01)
*H01L 25/18* (2023.01)
(Continued)

(52) U.S. Cl.
CPC .......... *H01L 23/5386* (2013.01); *H01L 25/18* (2013.01); *H02M 3/33576* (2013.01); *H02M 7/003* (2013.01)

(58) Field of Classification Search
CPC ................ H01L 23/5386; H01L 25/18; H02M 3/33576; H02M 7/003
(Continued)

(56) References Cited

U.S. PATENT DOCUMENTS 5,492,842 A    2/1996   Eytcheson et al.
5,519,253 A    5/1996   Lake et al.
(Continued)

FOREIGN PATENT DOCUMENTS

EP    2899757 A1    7/2015

OTHER PUBLICATIONS

Invitation to Pay Additional Fees and Partial Search for International Patent Application No. PCT/US2022/016653, dated Jun. 1, 2022, 14 pages.

*Primary Examiner* — Yemane Mehari
(74) *Attorney, Agent, or Firm* — BakerHostetler

(57) ABSTRACT

A power module includes a power substrate, a number of power semiconductor die, and a number of connector pins. The power substrate includes a number of conductive traces. The power semiconductor die are mounted on the power substrate and electrically coupled to the conductive traces. The connector pins are each electrically coupled to a different one of the conductive traces and configured to be interconnected such that the power semiconductor die provide an active front-end and a switching power converter. By providing the power semiconductor die such that they can be interconnected to form an active front-end and a switching power converter in the same power module, the power module may provide a significantly more compact power converter system using both an active front-end and switching power converter.

25 Claims, 5 Drawing Sheets

(51) Int. Cl.
*H02M 3/335* (2006.01)
*H02M 7/00* (2006.01)

(58) Field of Classification Search
USPC .......................................................... 363/242
See application file for complete search history.

(56) References Cited

U.S. PATENT DOCUMENTS

| | | | |
|---|---|---|---|
| 2010/0134979 A1* | 6/2010 | Obiraki | H01L 23/3735 |
| | | | 361/822 |
| 2011/0059581 A1* | 3/2011 | Horio | H01L 25/072 |
| | | | 438/123 |
| 2012/0228696 A1* | 9/2012 | Carpenter | H01L 23/49575 |
| | | | 257/329 |
| 2014/0254205 A1 | 9/2014 | Trainer et al. | |
| 2020/0395322 A1* | 12/2020 | McPherson | H01L 24/49 |
| 2021/0242124 A1 | 8/2021 | Kannan et al. | |

* cited by examiner

INTEGRATED POWER MODULE

CROSS-REFERENCE TO RELATED APPLICATIONS

This application is a continuation of U.S. patent application Ser. No. 17/178,435, filed Feb. 18, 2021 now U.S. Pat. No. 11,569,174 issued Jan. 31, 2023, which is incorporated herein by reference in its entirety.

FIELD OF THE DISCLOSURE

The present disclosure is related to power converter systems, and in particular to power modules for use in power converter systems.

BACKGROUND

A power converter system is used to convert or condition input power signals to provide desired output power signals. A typical power converter system includes a number of power modules electrically coupled to one another to provide a desired topology, where each power module includes a number of power semiconductor die on a power substrate in a housing. Generally, power modules are provided with a set number of power semiconductor die arranged in a standard configuration such as a full-bridge configuration, a half-bridge configuration, and the like. Depending on the topology of a given power converter system, the system may require a large number of power modules. This may lead to large and complex power converter systems, which may be undesirable for a given application.

SUMMARY

In one embodiment, a power module includes a power substrate, a number of power semiconductor die, and a number of connector pins. The power substrate includes a number of conductive traces. The power semiconductor die are mounted on the power substrate and electrically coupled to the conductive traces. The connector pins are each electrically coupled to a different one of the conductive traces and configured to be interconnected such that the power semiconductor die provide an active front-end and a switching power converter. By providing the power semiconductor die such that they can be interconnected to form an active front-end and a switching power converter in the same power module, the power module may provide a significantly more compact power converter system using both an active front-end and switching power converter.

In one embodiment, the conductive traces and connector pins are arranged such that a distance between ones of the connector pins that experience a voltage potential greater than 50 V during normal operation of the power module is at least twice as large as a distance between ones of the connector pins that experience a voltage potential less than 50 V during normal operation of the power module. By arranging the conductive traces and connector pins in this manner, the reliability of the power module can be improved while maintaining a small footprint and leakage inductance.

In one embodiment, a power converter system includes a primary power module, a secondary power module, and a transformer electrically coupled between the primary power module and the secondary power module. The primary power module includes a number of primary power transistor semiconductor die, which can be interconnected to provide an active front-end and a switching power converter. The secondary power module includes a number of secondary power transistor semiconductor die, which can be interconnected to provide a secondary switching power converter. By providing the primary power module such that it can provide both an active front-end and a switching power converter and separating the primary switching power converter and the secondary switching power converter using the transformer, a highly adaptable and isolated power converter system is provided with a reduced footprint and complexity.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
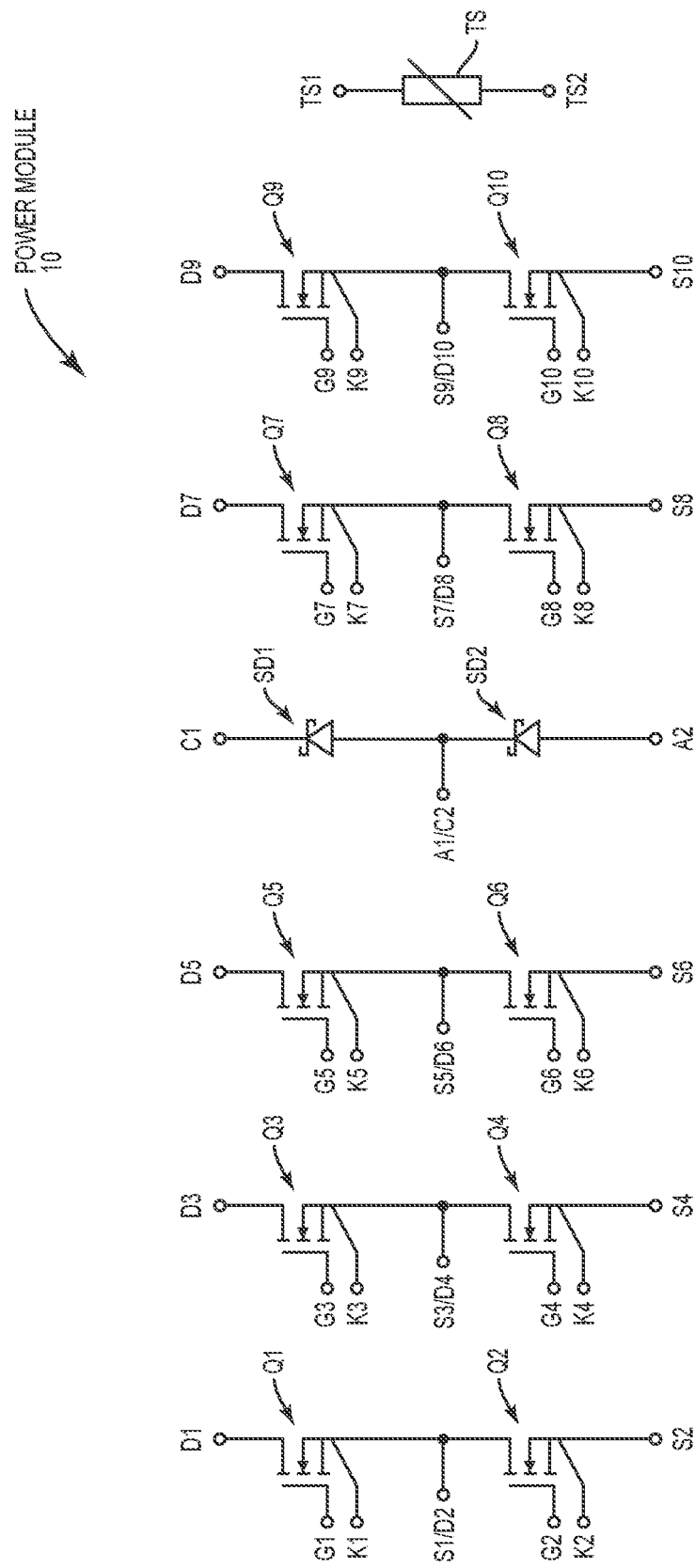
FIG. 1 is a schematic illustrating a topology for a power module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 shows a power module 10 according to one embodiment of the present disclosure. The power module 10 includes a number of power transistors Q (individually labeled as Q1-Q10), a number of power diodes SD (individually labeled as SD1 and SD2), and a temperature sensor TS. A first power transistor Q1 includes a gate contact G1, a drain contact D1, a source contact S1, and a Kelvin connector K1. A second power transistor Q2 includes a gate contact G2, a drain contact D2 electrically coupled to the source contact S1 of the first power transistor Q1, a source contact S2, and a Kelvin connector K2. A third power transistor Q3 includes a gate contact G3, a drain contact D3, a source contact S3, and a Kelvin connector K3. A fourth power transistor Q4 includes a gate contact G4, a drain contact D4 electrically coupled to the source contact S3 of the third power transistor Q3, a source contact S4, and a Kelvin connector K4. A fifth power transistor Q5 includes a gate contact G5, a drain contact D5, a source contact S5, and a Kelvin connector K5. A sixth power transistor Q6 includes a gate contact G6, a drain contact D6 coupled to the source contact S5 of the fifth power transistor Q5, a source contact S6, and a Kelvin connector K6. A first power diode D1 includes an anode contact A1 and a cathode contact C1. A second power diode D2 includes an anode contact A2 and a cathode contact C2 electrically coupled to the anode contact A1 of the first power diode D1. A seventh power transistor Q7 includes a gate contact G7, a drain contact D7, a source contact S7, and a Kelvin connector K7. An eighth power transistor Q8 includes a gate contact G8, a drain contact D8 electrically coupled to the source contact S7 of the seventh power transistor Q7, a source contact S8, and a Kelvin connector K8. A ninth power transistor Q9 includes a gate contact G9, a drain contact D9, a source contact S9, and a Kelvin connector K9. A tenth power transistor Q10 includes a gate contact G10, a drain contact D10 coupled to the source contact S9 of the ninth power transistor Q9, a source contact S10, and a Kelvin connector K10. The temperature sensor TS includes a first temperature sensor contact TS1 and a second temperature sensor contact TS2.

The contacts of each one of the power transistors Q, the power diodes D, and the temperature sensor TS are broken out to separate connector pins 12, which are electrically coupled to each contact, except in the case of the connection points between the components of the power module 10 that are electrically coupled, in which case only a single connector pin 12 is provided.

Figure 2:
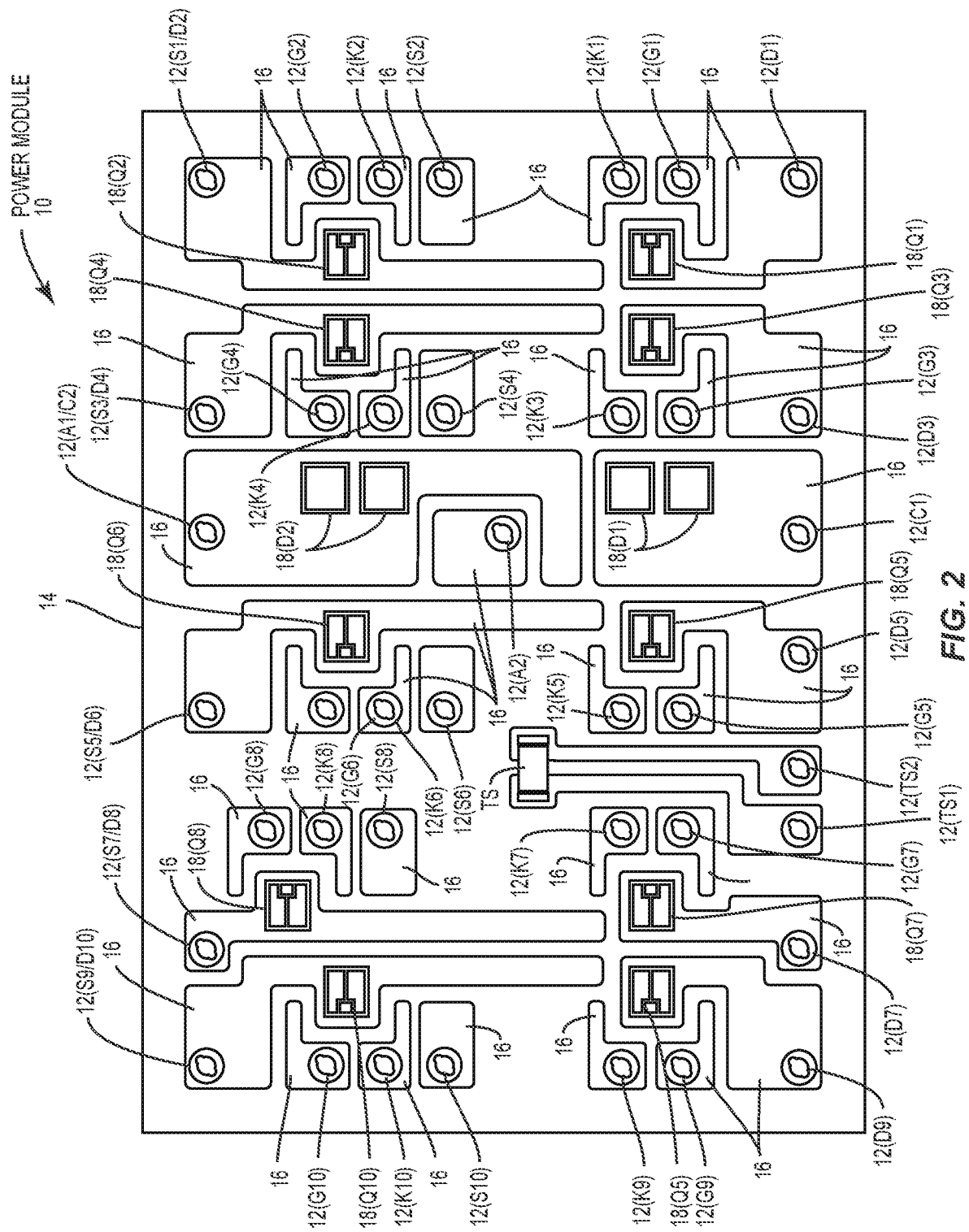
FIG. 2 illustrates a top-down view of a power substrate for a power module according to one embodiment of the present disclosure.

FIG. 2 shows a top-down view of a power substrate 14 of the power module 10 according to one embodiment of the present disclosure. As shown, the power substrate 14 includes a number of conductive traces 16, which are electrically isolated from one another. The power transistors Q and power diodes D are each provided via one or more power semiconductor die 18 mounted on the power substrate 14. While not shown, each one of the power transistors Q and power diodes D may comprise a single semiconductor die or multiple semiconductor die, which are coupled in parallel. In FIG. 2, each power transistor Q is provided via a single power semiconductor die 18 and each power diode D is provided via two power semiconductor die 18, which can be coupled in parallel (to provide a desired on-state current, for example). While not shown, wire bonds electrically couple contact pads on top of the power semiconductor die 18 to different ones of the conductive traces 16, which are in turn electrically coupled to connector pins 12.

Figure 3:
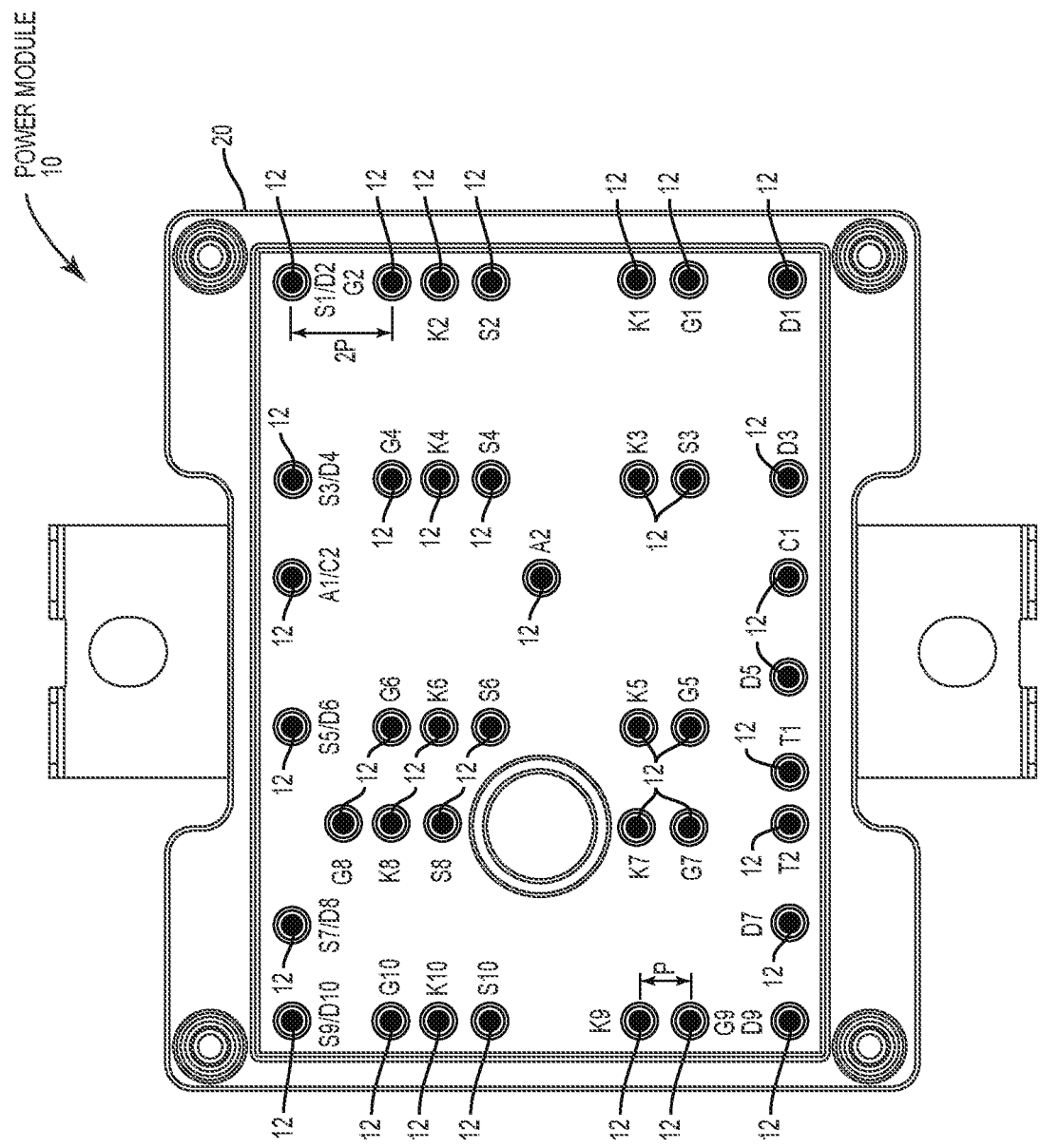
FIG. 3 illustrates a top-down view of a power module according to one embodiment of the present disclosure.

FIG. 3 shows a top-down view of the power module 10 including a housing 20. The power substrate 14 is inside the housing 20 such that the connector pins 12 extend vertically from the power substrate 14 and through one or more openings in the housing 20, where they are available for electrical connection to a power converter system. A footprint of the power module 10 is defined by a length L and width W of the housing 20 (L×W). In various embodiments, a footprint of the power module 10 is less than 100 cm². In various embodiments, the footprint of the power module 10 may be less than 80 cm², less than 70 cm², less than 60 cm², less than 50 cm², less than 40 cm², less than 30 cm², and less than 20 cm². The footprint of the power module 10 will depend on the power rating and thus application.

Figure 4:
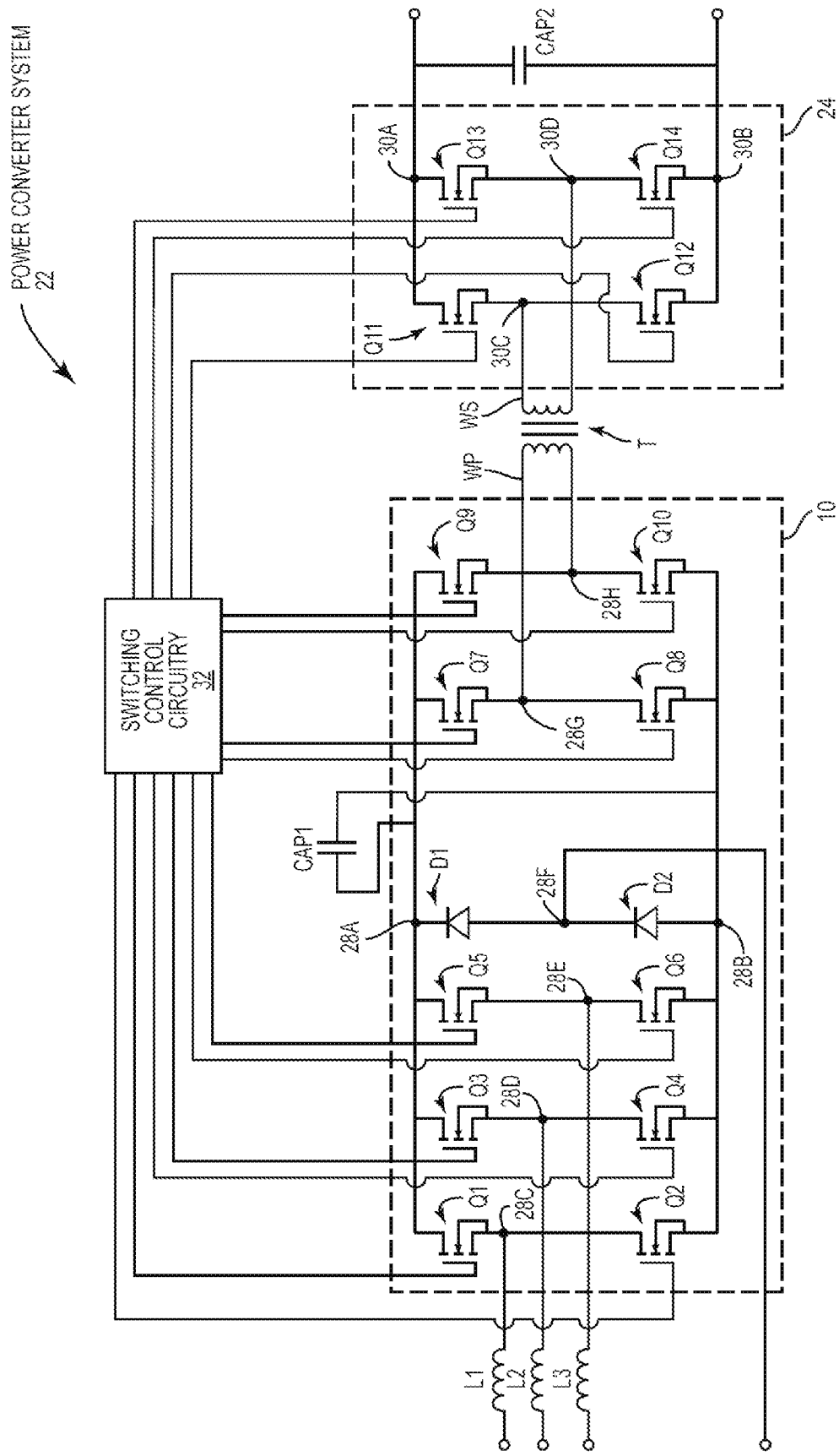
FIG. 4 is a schematic illustrating a topology for a power converter system according to one embodiment of the present disclosure.

Notably, the power transistors Q and the power diodes D can be interconnected via the connector pins 12 to provide an active front-end and a switching power converter in a single power module. Specifically, the first through sixth power transistors (Q1-Q6), the first power diode D1, and the second power diode D2 can be interconnected to provide the active front-end, while the seventh through tenth power transistors (Q7-Q10) can be interconnected to provide a full-bridge switching power converter. To illustrate this, FIG. 4 is a schematic illustrating a power converter system 22 including the power module 10, which may be referred to as a primary power module, and a secondary power module 24. Notably, the Kelvin connections are not shown to avoid obscuring the drawings. As shown, the connector pins (not shown in FIG. 4) of the power module 10 are interconnected to provide an active front-end including the first through sixth power transistors (Q1-Q6), the first power diode D1, and the second power diode D2. The connector pins are also interconnected to provide a full-bridge switching power converter including the seventh through tenth power transistors (Q7-Q10). To do so, the drain contact D of each of first power transistor Q1, the third power transistor Q3, the fifth power transistor Q5, the seventh power transistor Q7, and the ninth power transistor Q9, along with the cathode contact CAP1 of the first power diode D1 are electrically coupled to form a first coupled node 28A. The source contact S of each one of the second power transistor Q2, the fourth power transistor Q4, the sixth power transistor Q6, the eighth power transistor Q8, and the tenth power transistor Q10, along with the anode contact A2 of the second power diode D2 are electrically coupled to form a second coupled node 28B. A first capacitor CAP1 is coupled between the first coupled node 28A and the second coupled node 28B. The point at which the source contact S1 of the first power transistor Q1 and the drain contact D2 of the second power transistor Q2 are coupled is shown as a third coupled node 28C. The point at which the source contact S3 of the third power transistor Q3 and the drain contact D4 of the fourth power transistor Q4 are coupled is shown as a fourth coupled node 28D. The point at which the source contact S5 of the fifth power transistor Q5 and the drain contact D6 of the sixth power transistor Q6 is shown as a fifth coupled node 28E. The point at which the anode contact A1 of the first power diode D1 and the cathode contact C2 of the second power diode D2 is shown as a sixth coupled node 28F. The point at which the source contact S7 of the seventh power transistor Q7 and the drain contact D8 of the eighth power transistor Q8 are coupled is shown as a seventh coupled node 28G. The point at which the source contact S9 of the ninth power transistor Q9 and the drain contact D10 of the tenth power transistor Q10 are coupled is shown as an eighth coupled node 28H. A transformer T includes a primary winding WP coupled between the seventh coupled node 28G and the eighth coupled node 28H.

The secondary power module 24 includes an eleventh power transistor Q11, a twelfth power transistor Q12, a thirteenth power transistor Q13, and a fourteenth power transistor Q14. The eleventh power transistor Q11 includes a gate contact G11, a drain contact D11 coupled to a first additional coupled node 30A, and a source contact S11. While not shown, each one of the power transistors Q in the secondary power module 24 may include a Kelvin connection, similar to the power transistors Q in the power module 10 shown in FIG. 1. The twelfth power transistor Q12 includes a gate contact G12, a source contact S12 coupled to a second additional coupled node 30B, and a drain contact D12 coupled to the source contact S11 of the eleventh power transistor, shown as a third additional coupled node 30C. The thirteenth power transistor Q13 includes a gate contact G13, a drain contact D13 coupled to the first additional coupled node 30A, and a source contact S13. The fourteenth power transistor Q14 includes a gate contact G14, a drain contact D14 coupled to the source contact S13 of the thirteenth power transistor Q13, shown as a fourth additional coupled node 30D, and a source contact S14 coupled to the second additional coupled node 30B. A secondary winding WS of the transformer T is coupled between the third additional coupled node 30C and the fourth additional coupled node 30D. A second capacitor CAP2 is coupled between the first additional coupled node 30A and the second additional coupled node 30B.

In operation, an AC power source such as a power grid is electrically coupled to the power module 10 and a load may be electrically coupled to the secondary power module 24. Specifically, a first phase AC signal is provided at the third coupled node 28C via a first inductor L1, a second phase AC signal is provided at the fourth coupled node 28D via a second inductor L2, a third phase AC signal is provided at the fifth coupled node 28E via a third inductor L3, and a neutral signal is provided at the sixth coupled node 28F. A load (not shown) is coupled between the first additional coupled node 30A and the second additional coupled node 30B. Switching control circuitry 32 is coupled to the gate contact G of each one of the power transistors Q. The switching control circuitry 32 provides control signals to each one of the power transistors Q such that the first through sixth power transistors (Q1-Q6), along with the first power diode D1 and the second power diode D2, operate as an active front-end. In particular, the first through sixth power transistors (Q1-Q6) are switched in a given pattern with respect to the incoming AC power signal to convert the incoming AC signal into a DC signal while presenting as a resistive load to the AC power source. Those skilled in the art will appreciate that using an active front-end rather than a simple rectifier improves power factor and reduces harmonics. The switching control circuitry 32 provides control signals to the seventh through tenth power transistors Q7-Q10 such that they operate as a full-bridge switching power converter. Accordingly, the DC signal provided from the active front-end is converted back into a high-frequency (e.g., 10 kHz to 10 MHz) AC signal. This is so that the signal can be coupled via the transformer T to the secondary power module 24. Converting the low-frequency (e.g., 60 Hz) AC signal from the AC source (e.g., the power grid) into a DC signal via the active front-end and then to the high-frequency AC signal allows for improved performance and reduced transformer size. At the secondary power module 24, the switching control circuitry 32 provides control signals to the eleventh through fourteenth power transistors Q11-Q14 such that they operate as an additional full-bridge switching power converter in order convert the high-frequency AC signal to a DC output signal, which is delivered to the load.

Figure 5:
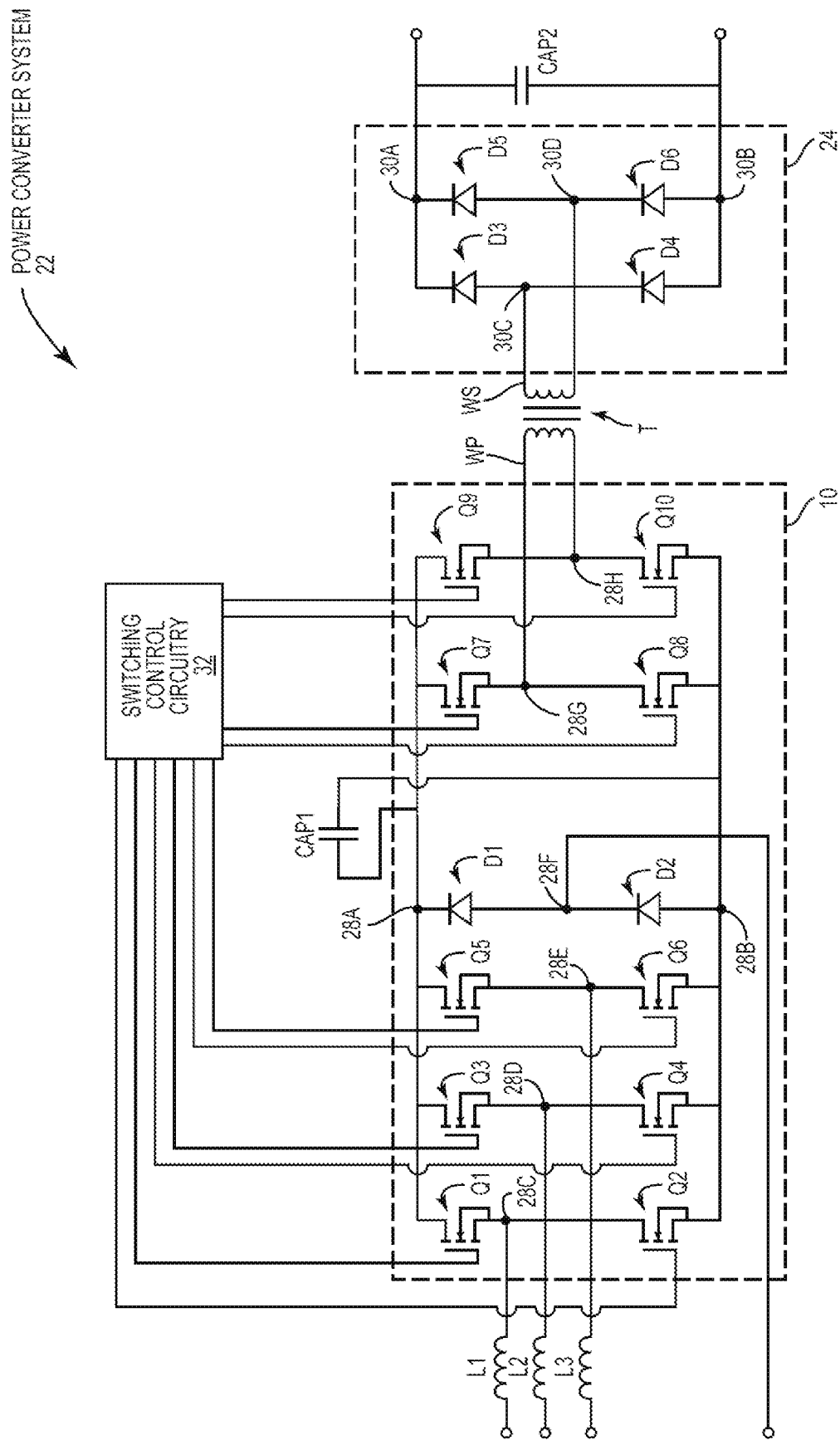
FIG. 5 is a schematic illustrating a topology for a power converter system according to one embodiment of the present disclosure.

FIG. 5 shows the power converter system 22 according to an additional embodiment of the present disclosure. The power converter system 22 shown in FIG. 5 is similar to that shown in FIG. 4, except that the power transistors Q of the secondary power module 24 are replaced with power diodes D. In particular, a third power diode D3 includes an anode contact A3 and a cathode contact C3 coupled to the first additional coupled node 30A. A fourth power diode D4 includes an anode contact A4 coupled to the second additional coupled node 30B and a cathode contact C4 coupled to the anode contact A3 of the third power diode D3, shown as the third additional coupled node 30C. A fifth power diode D5 includes an anode contact A5 and a cathode contact C5 coupled to the first additional coupled node 30A. A sixth power diode D6 includes an anode contact A6 coupled to the second additional coupled node 30B and a cathode contact C6 coupled to the anode contact A5 of the fifth power diode D5, shown as a fourth additional coupled node 30D.

The power converter system 22 shown in FIG. 5 operates in substantially the same manner as discussed above with respect to FIG. 4, except that the power diodes operate without control signals from the switching control circuitry 32. While the power converter system 22 shown in FIG. 4 can be operated bi-directionally such that DC signals from the load can be converted into AC signals, the power converter system 22 shown in FIG. 5 is unidirectional. In general, the secondary power module 24 can be exchanged for any off-the-shelf power converter in order to meet a given set of application requirements.

The power converter system 22 may be used, for example, as an on-board battery charger for an electric or hybrid vehicle. Accordingly, AC power from the grid is converted into a DC signal suitable for charging a battery. Providing the active front-end and switching power converter in the power module 10 and an additional switching power converter in the secondary power module 24 accomplishes this task while providing necessary galvanic isolation via the transformer T in a way that balances performance and safety. In particular, the division of the topology between the power module 10 and the secondary power module 24 is important, as it provides galvanic isolation to ensure that the vehicle chassis is never coupled to the grid and enabling a reduced overall footprint of the solution. If the power module 10 and the secondary power module 24 were to be combined into a single module, clearance and creepage requirements for isolation would require a very large footprint of such a module. The divisional of components in the power module 10 and the secondary power module 24 thus enables a balance between size and safety.

In addition to converting three-phase AC signals into DC signals, the power converter system 22 can also be operated to convert single-phase AC signals into DC signals by operating only one of the power transistor pairs in the active front-end, or by operating the power transistor pairs in parallel. Further, by changing the connections between the power transistors and the control signals provided thereto, the power module 10 may perform DC to DC conversion and AC to AC conversion. The power module 10 thus provides a highly adaptable, compact, and reliable platform for multiple applications. Further, the power transistors Q in the switching power converter portion of the power module 10 may be operated as a half-bridge switching power converter (by only operating two of the four power transistors Q or by operating the pairs of power transistors Q in parallel). In general, the power transistors Q and power diodes D of the power module 10 can be configured in any number of useful configurations, all of which are contemplated herein.

Focusing on the power module 10 in isolation, the present disclosure contemplates a single power module including both an active front-end and a switching power converter. In combining an active front-end and a switching power converter into a single power module, two opposing design criteria must be considered. First, safety requirements dictate minimum clearance and creepage distances between current paths in the power module. These safety requirements generally push towards having more space between points experiencing a significant voltage differential to avoid shorting and/or arcing. Second, performance requirements dictate leakage inductance requirements, where a smaller leakage inductance is desired. Leakage inductance is determined at least in part by the distance between parts in a power module, where smaller distances between parts lead to less leakage inductance. Accordingly, a designer must balance both safety and performance when designing a power module. In the case of the power module, the layout and design choices enable a desirable tradeoff between these concerns.

The first design choice enabling this desired tradeoff is discussed above. In particular, choosing which parts to include in a single power module while still being able to maintain a desired isolation in an overall power converter system. By choosing to provide an active front-end and switching power converter in a single module, and not additional parts, such a balance is obtained.

In addition to the above, the layout of the power module 10 is such that for connector pins 12 experiencing a voltage differential greater than 50 V, a distance between the connector pins 12 is at least twice as large as for connector pins 12 that do not experience such a voltage differential. Put another way, each one of the connector pins 12 has a pitch that is equal to the distance between the center of two adjacent connector pins 12. Connector pins 12 experiencing a voltage differential greater than 50 V may have a distance of at least twice a pin pitch. This is shown in FIGS. 2 and 3, where, for example, the connector pin 12 coupled to the gate contact G1 of the first power transistor Q1 is at least twice as far from the connector pin 12 coupled to the drain contact D1 than from the connector pin 12 coupled to the Kelvin connector K1. In FIG. 3, the pitch is illustrated as P between the gate contact G9 of the ninth power transistor Q9 and the Kelvin connector K9 of the ninth power transistor Q9. A distance between the gate contact G2 of the second power transistor Q2 and a source contact S1 of the first power transistor Q1 and the drain contact D2 of the second power transistor Q2 is at least 2P. Laying out the power module 10 in this manner achieves a desirable balance between leakage inductance (by minimizing distance between components) while meeting or exceeding clearance and creepage requirements. Notably, it is not required that every pair of connector pins experiencing a voltage differential greater than 50 V be separated from others by a distance that is at least twice as large than connector pins that do not. Rather, in some embodiments the voltage differential between connector pins is used as a guide to determine which of the connector pins to separate more than other connector pins, but is not a strict design requirement.

Clearance and creepage requirements may be dictated, for example, by standards such as IPC-2221, IPC-9592B, UL-610010-1, and IEC-60950-1. In various embodiments, the housing 20 of the power module 10 may have a footprint less than 80 cm² while still meeting any required standards. In some embodiments, a blocking voltage of each one of the power transistors Q and each one of the power diodes D1 is greater than 650 V, and a current rating is greater than 5 A. Accordingly, the power module 10 provides a highly compact and yet versatile and high performing module.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed:

1. A power module comprising:
   a power substrate comprising a plurality of conductive traces;
   a plurality of power semiconductor die mounted on the power substrate and electrically coupled to the plurality of conductive traces; and
   a plurality of connector pins, each electrically coupled to a different one of the plurality of conductive traces, wherein the plurality of connector pins are configured to be interconnected such that the plurality of power semiconductor die provide an active front-end and a switching power converter.

2. The power module of claim 1 wherein the active front-end is configured to convert AC signals to DC signals.

3. The power module of claim 1 wherein the plurality of connector pins are configured to be interconnected in a first configuration such that the active front-end is capable of converting single-phase AC signals to DC signals.

4. The power module of claim 1 wherein the plurality of connector pins are configured to be interconnected in a second configuration such that the active front-end is capable of converting three-phase AC signals to DC signals.

5. The power module of claim 1 wherein the plurality of connector pins are configured to be interconnected in a third configuration such that the switching power converter is a full-bridge switching power converter.

6. The power module of claim 1 wherein the plurality of connector pins are configured to be interconnected in a fourth configuration such that the switching power converter is a half-bridge power converter.

7. The power module of claim 1 wherein the plurality of conductive traces and the plurality of connector pins are arranged such that a distance between ones of the connector pins that experience a voltage potential greater than 50 V during normal operation of the power module is at least twice as large as a distance between ones of the connector pins that experience a voltage potential less than 50 V during normal operation of the power module.

8. The power module of claim 1 wherein:
   the power module comprises a housing in which the power substrate is provided;
   a footprint of the housing is less than 80 cm²; and
   the plurality of conductive traces and the plurality of connector pins are provided such that the power module meets or exceeds standards for creepage and clearance.

9. The power module of claim 8 wherein:
   the active front-end comprises six power transistor semiconductor die and two power diode semiconductor die; and
   the switching power converter comprises four power transistor semiconductor die.

10. The power module of claim 9 wherein:
    a blocking voltage of each one of the power transistor semiconductor die and each one of the power diode semiconductor die is at least 650 V; and
    a current rating of each one of the power transistor semiconductor die and each one of the power diode semiconductor die is at least 5 A.

11. The power module of claim 1 wherein:
    the active front-end is configured to operate bidirectionally such that in a first direction the active front-end is configured to convert AC signals to DC signals and in a second direction the active front-end is configured to convert DC signals to AC signals; and
    the switching power converter is further configured to operate bidirectionally such that in a first direction the switching power converter is configured to convert DC signals to AC signals and in a second direction the active front-end is configured to convert AC signals to DC signals.

12. The power module of claim 1 wherein:
    the plurality of power semiconductor die comprises a plurality of power transistor semiconductor die, each comprising a gate, a drain, a source, and a kelvin connection; and
    the gate, the drain, the source, and the kelvin connection of each one of the plurality of power transistor semiconductor die are coupled to a different one of the plurality of connector pins.

13. The power module of claim 1 wherein the plurality of power semiconductor die comprise silicon carbide semiconductor die.

14. A power module comprising:
    a housing;
    a power substrate within the housing, the power substrate comprising a plurality of conductive traces;
    a plurality of power semiconductor die mounted on the power substrate and coupled to the plurality of conductive traces; and
    a plurality of connector pins, each coupled to a different one of the plurality of conductive traces, wherein:
    the plurality of connector pins are configured to be interconnected such that the plurality of power semiconductor die provides an active front-end and a switching power converter;
    a footprint of the housing is less than 80 cm²; and
    the plurality of conductive traces and the plurality of connector pins are provided such that the power module meets or exceeds standards for creepage and clearance.

15. The power module of claim 14 wherein the active front-end is configured to convert AC signals to DC signals.

16. The power module of claim 14 wherein the plurality of connector pins are configured to be interconnected in a first configuration such that the active front-end is capable of converting single-phase AC signals to DC signals.

17. The power module of claim 14 wherein the plurality of connector pins are configured to be interconnected in a second configuration such that the active front-end is capable of converting three-phase AC signals to DC signals.

18. The power module of claim 14 wherein the plurality of connector pins are configured to be interconnected in a third configuration such that the switching power converter is a full-bridge switching power converter.

19. The power module of claim 14 wherein the plurality of connector pins are configured to be interconnected in a fourth configuration such that the switching power converter is a half-bridge power converter.

20. The power module of claim 14 wherein the plurality of conductive traces and the plurality of connector pins are arranged such that a distance between ones of the plurality of connector pins that experience a voltage potential greater than 50 V during normal operation of the power module is at least twice as large as a distance between ones of the plurality of connector pins that experience a voltage potential less than 50 V during normal operation of the power module.

21. The power module of claim 14 wherein:
the active front-end comprises six power transistor semiconductor die and two power diode semiconductor die; and
the power module comprises four power transistor semiconductor die.

22. The power module of claim 21 wherein:
a blocking voltage of each one of the power transistor semiconductor die and each one of the power diode semiconductor die is at least 650 V; and
a current rating of each one of the power transistor semiconductor die and each one of the power diode semiconductor die is at least 5 A.

23. The power module of claim 14 wherein:
the active front-end is configured to operate bidirectionally such that in a first direction the active front-end is configured to convert AC signals to DC signals and in a second direction the active front-end is configured to convert DC signals to AC signals; and
the switching power converter is further configured to operate bidirectionally such that in a first direction the switching power converter is configured to convert DC signals to AC signals and in a second direction the active front-end is configured to convert AC signals to DC signals.

24. The power module of claim 14 wherein:
each one of the plurality of power semiconductor die comprises a gate, a drain, a source, and a kelvin connection; and
the gate, the drain, the source, and the kelvin connection of each one of the plurality of power semiconductor die are coupled to a different one of the plurality of connector pins.

25. The power module of claim 14 wherein the plurality of power semiconductor die comprise silicon carbide semiconductor die.

* * * * *